United States Patent
Krell et al.

(10) Patent No.: US 9,012,045 B2
(45) Date of Patent: Apr. 21, 2015

(54) TRANSPARENT COMPOSITE PANE FOR SAFETY APPLICATIONS

(75) Inventors: Andreas Krell, Dresden (DE); Elmar Strassburger, Kandern (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 14/236,530

(22) PCT Filed: Jul. 23, 2012

(86) PCT No.: PCT/EP2012/064372
§ 371 (c)(1),
(2), (4) Date: May 7, 2014

(87) PCT Pub. No.: WO2013/017448
PCT Pub. Date: Feb. 7, 2013

(65) Prior Publication Data
US 2014/0255704 A1   Sep. 11, 2014

(30) Foreign Application Priority Data
Aug. 3, 2011 (DE) .......................... 10 2011 080 378

(51) Int. Cl.
| | | |
|---|---|---|
| *B32B 17/06* | (2006.01) | |
| *B32B 18/00* | (2006.01) | |
| *F41H 5/04* | (2006.01) | |
| *C30B 29/26* | (2006.01) | |
| *B32B 9/00* | (2006.01) | |

(52) U.S. Cl.
CPC .............. *F41H 5/0407* (2013.01); *C30B 29/26* (2013.01); *F41H 5/0428* (2013.01); *B32B 9/00* (2013.01)

(58) Field of Classification Search
USPC ......... 428/426, 428, 432, 688, 689, 699, 700, 428/701, 702
See application file for complete search history.

(56) References Cited

U.S. PATENT DOCUMENTS

| | | | |
|---|---|---|---|
| 3,736,158 A | 5/1973 | Cullen et al. | |
| 7,584,689 B2 | 9/2009 | Jones et al. | |
| 8,695,476 B2 * | 4/2014 | Kucherov et al. | ............ 89/36.02 |
| 2004/0266605 A1 | 12/2004 | Villalobos et al. | |
| 2005/0061229 A1 | 3/2005 | Stone-Sundberg et al. | |
| 2007/0087204 A1 | 4/2007 | Bayya et al. | |

(Continued)

FOREIGN PATENT DOCUMENTS

| | | |
|---|---|---|
| DE | 2162897 A | 9/1972 |
| DE | 202008014264 | 3/2009 |

(Continued)

OTHER PUBLICATIONS

Gilde et al., "Evaluation of Hot Isostatic Pressing Parameters on the Optical and Ballistic Properties of Spinel for Transparent Armor," Proc. of the 25th US Army Science Conference, Nov. 27, 2006-Nov. 30, 2006, 8 pages.

(Continued)

*Primary Examiner* — David Sample
*Assistant Examiner* — Lauren Colgan
(74) *Attorney, Agent, or Firm* — Greenblum & Bernstein, P.L.C.

(57) ABSTRACT

Transparent composite pane for safety applications. The composite pane is composed of multiple layers which are arranged behind one another. At least one of the layers is composed of, a plate or plates arranged in a mosaic or in series, of monocrystalline magnesium aluminate spinel.

20 Claims, 1 Drawing Sheet

(56) References Cited

U.S. PATENT DOCUMENTS

Figure 1:
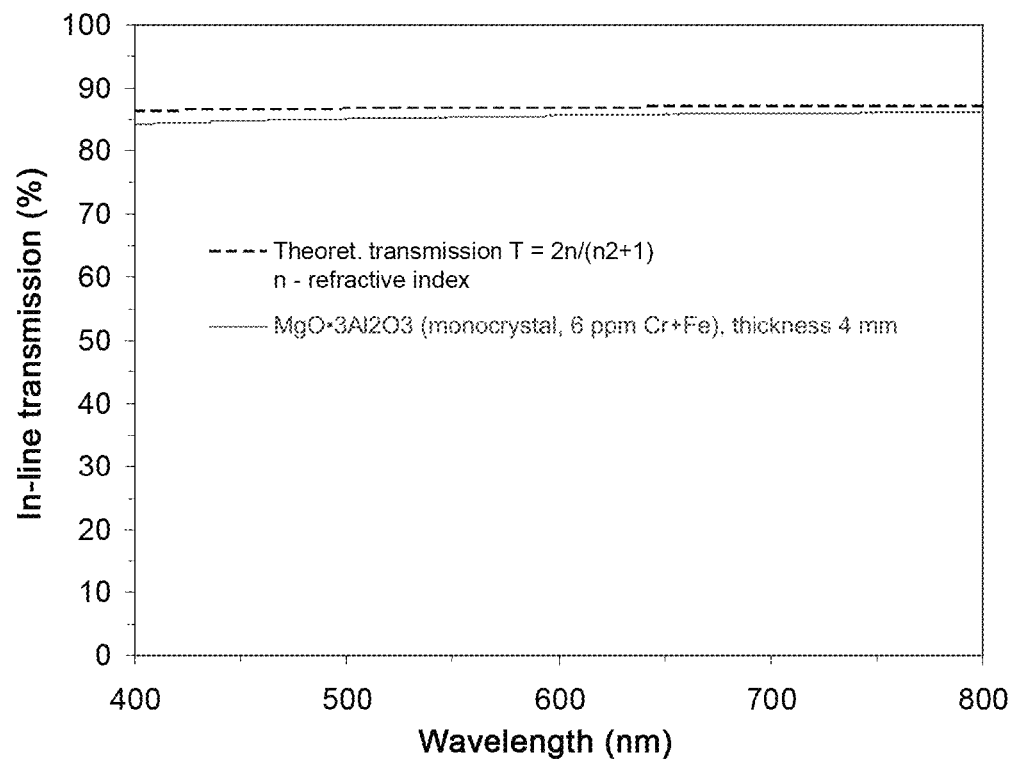

2009/0308239 A1* 12/2009 Jones et al. .......... 89/36.02
2009/0320675 A1   12/2009 Landingham et al.
2010/0288117 A1* 11/2010 Jones et al. .......... 89/36.02
2011/0223423 A1    9/2011 Ozaki et al.

FOREIGN PATENT DOCUMENTS

EP        2275772 A    1/2011
WO    WO2008147391 A3  12/2008

OTHER PUBLICATIONS

Strassburger et al., "Fragmentation of Ceramics under Ballistic Impact," 25th International Symposium on Ballistics, Beijing, China, May 17, 2010-May 21, 2010, 8 pages.
Krell et al., "Ballistic Strength of Opaque and Transparent Armor", American Ceramic Society Bulletin, vol. 86, No. 4, 7 pages.
Patel et al., "Trasparent Armor," AMPTIAC Newsletter, vol. 4, No. 3, 2000, 6 pages.
Haney, "Deformation Mechanisms in High Perfomance Transparent Ceramics Due to Indentation and Impact Events," University of Florida, 2011, 24 pages.
Patterson et al., "Transparent $MgAl_2O_4$ Spinel—Revisited," Ceramic Engineering & Science Proceedings, vol. 21, Issue 4, 2000, 4 pages.
Krell et al., "Grain Size-Dependent Hardness of Transparent Magnesium Aluminate Spinel," Int. J. App. Cerm. Technol., 8(5), 2010, pp. 1108-1114.
Zhang et al., "Dynamic Fracture in Brittle Solids at High Rates of Loading," Transactions of the ASME, vol. 70, May 2003, 4 pages.
Krell et al., "Advanced Spinel and Sub-μm $Al_2O_3$ for Transparent Armour Applications," Journal of European Cermaic Society 29 (2009), pp. 275-281.
Krell et al., "<1210>-Zone Fracture Anistropy of Sapphire," Phys. Stat. Sol., (a)52, K45 (1979).
Myatt et al., "Optical Contacting: Changing the Interface of Optics," Laser Focus World, Jan. 2006.
Kuramata et al., "High-Quality GaN Epitaxial Layer Grown by Metalorganic Vapor Phase Epitaxy on (111) $MgAl_2O_4$ Substrate," App. Phys. Lett. 67 (17), Oct. 23, 1995.
McGuire et al., "Large Area Edge-Bonded Flat and Curved Sapphire Windows," SPIE AeroSense Symposium, Apr. 16, 2001.

* cited by examiner

TRANSPARENT COMPOSITE PANE FOR SAFETY APPLICATIONS

The invention relates to the field of ceramics and relates to transparent composite panes for safety applications which are typically constructed from multiple layers of ceramic, glass and plastic plates possibly connected to one another by a connection medium and which have an increased loadability. They are used as transparent protective components, particularly where a light and safe transparent pane or window is desired, such as for vehicles, flying objects or personal protection.

Safety windows, in particular as bullet-resistant transparent protection, are, in particular for vehicles and flying objects, subject to constantly increasing demands for lower weight or—in reference to the space requirement—thinner panes with a simultaneously increasing safety need. Traditionally known bullet-proof windows cannot satisfy these demands for all cases of use, so that for approx. the last 10 years, broad international developments are known for the substitution of, above all, the outer layer (or layers) of laminated composite windows by monocrystalline or polycrystalline ceramic materials. A description of the typical design and a ballistic trial was, for example, given by Patel, et al. for a ceramic/glass/polycarbonate composite window in which the ceramic was a sintered (that is, polycrystalline) AlON material (P. J. Patel, et al.: AMPTIAC Newsletter 4(2000)3, 1-5+13).

The number of possible candidate materials for the ceramic component of safety panes is relatively small to this day and still corresponds to a list given in U.S. Pat. No. 7,584,689 B2, among other things:
- colorless $Al_2O_3$ monocrystals (usually referred to as "sapphire" or corundum),
- polycrystalline $Al_2O_3$ sintered ceramic (only usable in a very limited manner, since scattering losses occur due to the birefringence in the non-cubic corundum crystallites, which scattering losses allow this ceramic to appear more translucent than transparent at thicknesses >1 mm),
- polycrystalline sintered ceramic of aluminum oxynitride ("AlON", cubic crystal system),
- polycrystalline sintered ceramic of magnesium aluminate spinel (usually referred to as $MgO.nAl_2O_3$ with $n \approx 1$ and therefore often referred to as $MgAl_2O_4$, cubic crystal lattice).

To this day, the plurality of other known transparent sintered ceramics of a cubic crystal structure does not play a role for reasons of price or because of mechanical parameters which are too low for transparent protection.

As is known, the terms transparent or transparency refer to an ability to be seen through clearly in distinction from components which are merely translucent, that is, permit the transmission of light.

In the last 10 years, the development of the materials in this field was strongly concentrated on the group of polycrystalline sintered ceramics, particularly in reference to criticized general disadvantages of the monocrystals (high costs with a low-flexibility, more difficult production of larger or non-planar shapes).

As a result, these developments were surprising with the finding that:
- not only did transparent $Al_2O_3$ sintered ceramic (with a sub-μm structure) prove to be ballistically more stable than $Al_2O_3$ monocrystals of a different orientation (which, in light of higher hardness, strength and fracture toughness of the fine-crystalline sintered ceramic, could appear to be obvious),
- but also transparent fine-crystalline spinel ceramics exhibit a higher protective effect in the ballistic test than sapphire—despite the lower level of nearly every mechanical parameter of the spinel ceramics.

(A. Krell, et al.: J. Europ. Ceram. Soc. 29 (2009) 2, 275-281). Up to now, this behavior has been interpreted such that, during the impact of a projectile, the polycrystalline sintered ceramics show a fracturing behavior which is more advantageous for the protective effect than do monocrystals, so that differently shaped fragments are formed and the polycrystalline pane or the fragments thereof ultimately have a more marked effect on the projectile than is the case with the use of monocrystals (A. Krell, et al.: Am. Ceram. Soc. Bull 86 (2007) 4, 9201-9207; E. Strassburger, et al.: in: 25th International Symposium on Ballistics, Peking 2010, pp. 1172-1179).

On the other hand, the research of the previous years has also shown serious difficulties in the development of suitable polycrystalline protective ceramics. These difficulties relate to both the transparency and also the achievable degree of absence of defects (that is, the minimization of the number and size of visible defects in the transparent material). Thus, although literature results with an in-line transmission of, for example, 82% for a 1 mm thin spinel sample appear to be very close to the theoretically achievable upper limit of 87%, they could still be insufficient for a use as transparent protection: If a ceramic thickness of, for example, 3.5 mm is required to securely stop a steel-core projectile on impact at 850 m/s (which most likely represents a lower limit for many real applications), then the aforementioned spinel ceramic would, at this thickness, have only a transmission of $\{(82/87)^{3.5}\} \cdot 87\% = 71\%$—which together with the, also not completely negligible, losses at the other components of the composite window (glass backing and polycarbonate backing, interfaces) could, at least for an approval for road traffic, become critical.

This is added to by the experience that the polycrystalline sintered ceramics are not necessarily able to be produced without visible defects, such as this is known from the growth of monocrystals. Delivery requirements such as "no bubbles, inclusions or milky cloudinesses" can hardly be satisfied in such absolute terms for polycrystalline sintered ceramics.

Although the growth of monocrystals ultimately offers certain advantages, in the result of the aforementioned comparative ballistic tests of monocrystals and polycrystals, not only has the $Al_2O_3$ monocrystal received less and less attention in the discussion of transparent ceramic protection. Because a high hardness is generally considered to be the most important requirement of a high protective effect in addition to a high modulus of elasticity, yet the
- hardnesses of all monocrystals are generally below those of the corresponding densely sintered polycrystalline ceramics (at least when compared to more finely grained structures) and,
- in comparison with sapphire, all other transparent ceramic monocrystals produced with a reasonable cost have hardnesses even further below the $Al_2O_3$ monocrystal, the possibility of a development, production and reasonable use of transparent composite windows using monocrystals other than $Al_2O_3$ monocrystals has not been taken into consideration up to now.

In light of the described limits of previous developments with monocrystalline and with polycrystalline ceramics, the object of the invention is the disclosure of a transparent composite pane for safety applications which avoids both the previous transmission disadvantages and quality disadvantages of transparent polycrystalline ceramics and also the disadvantages in the protective effect, as $Al_2O_3$ monocrystals show them in comparison with fine-crystalline transparent $Al_2O_3$ sintered ceramics or spinel sintered ceramics.

The object is attained by the invention disclosed in the claims. Advantageous embodiments are the subject matter of the dependent claims.

With the transparent composite pane for safety applications according to the invention, the composite is composed of multiple layers, which are arranged behind one another, and at least one layer is a plate, or plates arranged in a mosaic or series, of monocrystalline magnesium aluminate spinel.

Advantageously, the other layers are composed of glasses, ceramics and/or plastics.

Also advantageously, the layers are connected to one another by an adhesion-promoting connection medium.

Also advantageously, one or multiple layers of plates of monocrystalline magnesium aluminate spinel arranged in a mosaic or series are combined to form a larger transparent composite pane.

It is also advantageous if joint gaps between plates of monocrystalline magnesium aluminate spinel are respectively covered outwardly by at least one larger cover plate of a transparent material.

It is likewise advantageous if the at least one plate is composed of monocrystalline magnesium aluminate spinel with a <111> orientation of the surface normals.

It is also advantageous if the monocrystalline magnesium aluminate spinel has a chemical composition of $MgO.nAl_2O_3$ with a parameter n within the range of 0.9 to 3.5.

According to the invention, the use of the transparent composite pane for safety applications and/or protective applications occurs for panes or windows in the civilian and military sector.

Advantageously, the use occurs for areas of application in which light composite panes with a particularly high absence of defects and high protective effect are required.

Also advantageously, the use occurs for safety panes or windows and/or protective panes or windows in vehicles, flying objects or in personal protection.

With the solution according to the invention, a transparent composite pane for safety applications is disclosed for the first time which avoids both the previous transmission disadvantages and quality disadvantages of transparent polycrystalline ceramics and also the disadvantages in the protective effect, as $Al_2O_3$ monocrystals show them in comparison with fine-crystalline transparent $Al_2O_3$ sintered ceramics or spinel sintered ceramics.

This is achieved by a transparent composite pane in which the composite is composed of multiple layers which are arranged behind one another and of which at least one layer is composed of one plate, or multiple plates arranged in a mosaic or series, of monocrystalline magnesium aluminate spinel.

Surprisingly, in deviating from all previously known considerations for developing composite windows for the application as transparent protection, it was possible to attain the object according to the invention in that a transparent composite pane having the sequence of an optional external cover plate, advantageously of relatively thin mineral glass,
the distinctiveness of one plate or one or multiple layers of plates of monocrystalline magnesium aluminate spinel,
a generally multiply laminated glass backing, and
a rear plate of a transparent polymer (for example, polycarbonate), is connected and held together either by a frame or, advantageously, by the thinnest possible layers (≤0.8 mm, preferably ≤0.2 mm) of a transparent adhesive matched to the refractive index as a connection medium. The use of this type of adhesives is generally known (EP 2275772 A1, U.S. Pat. No. 7,584,689 B2 and US 2009/0320675 A1). Alternatively, adhesive-free, chemically-active bondings can also be used (C. Myatt, et al., Precision Photonics, Doc. #20060101), the applicability of which for polycrystalline (sintered) magnesium aluminate ceramics was described by R. O. Loutfy (www.virtualacquisitionshowcase.com/document/1480/briefing). Specifically, the binding of the joint gaps of adjacent monocrystalline magnesium aluminate spinel plates can also be produced using ceramic bonding processes, as for example described in US 2011/0039094 A1 or by McGuire, et al. for sapphire monocrystalline plates (Proc. *SPIE AeroSense Symposium*, Orlando, Fla., Apr. 16, 2001) or by—for example, also laser-assisted—diffusion bonding.

The transparent composite panes according to the invention can thereby contain a plate or one or multiple layers of plates of monocrystalline magnesium aluminate spinel, preferably with a mosaic structure or an arrangement in series on a backing. This type of structure is, for example, described in U.S. Pat. No. 7,584,689 B2, US—2009/0320675 A1 or DE 20 2008 014 264 U1. One or multiple composite panes of this type can also be processed to form a larger window.

For a structure of the composite pane according to the invention with multiple plates of monocrystalline magnesium aluminate monocrystal arranged next to one another in a mosaic or in series, it is advantageous if these plates are also covered by a cover plate of relatively thin mineral glass for the protection of possible joint gaps.

Surprisingly, ballistics trials with 7.62 mm×51 APFN projectiles (with steel core) at an 840 m/s projectile speed in DoP tests ("depth of penetration") with plates of monocrystalline magnesium aluminate spinel of an Al-rich composition (approx. $MgO.3Al_2O_3$) showed a lower penetration depth of the projectile fragments in the backings located therebehind for the measurement of the protective effect than for all comparatively tested polycrystalline sintered spinel ceramics of the same thickness (independent of the grain sizes thereof [0.7-70 µm] and Vickers hardnesses [with a testing load of 98.1 N: HV10=12.0–14.7 GPa]; the hardness of the tested monocrystalline magnesium aluminate spinel was, at HV10=11.0 GPa, significantly lower).

The orientation of the plates of monocrystalline magnesium aluminate spinel according to the invention in the transparent composite panes is without greater importance for transparency and protective effect; up to now, however, magnesium aluminate spinels of a growth direction other than <111> or <100> have hardly become known, so that, among other things, planar surfaces perpendicular to the growth direction are present during the cutting, which surfaces correspond to (111) planes or (100) planes (with <111> or <100> as an orientation of the surface normals). Because magnesium aluminate spinels in a <111> direction were easier to grow up to now, this is the clearly predominantly prevalent orientation and, therefore, can advantageously also be used.

Likewise unimportant for the incredibly high protective effect is the chemical composition of the magnesium aluminate spinel according to the invention of $MgO.nAl_2O_3$, which can be freely selected within the range of roughly n=0.9–3.5 as long as the growth conditions still lead to a clearly transparent single-phase material without MgO precipitations or $Al_2O_3$ precipitations. Although the hardness of the spinel decreases with a rising $Al_2O_3$ content (rising n) (A. Krell, et al.: Int. J. Appl. Ceram. Technol. 8 (2011) DO1:10.1111/j.1744-7402.2010.02583.x), the advantage of the protective effect of the monocrystal in comparison with the polycrystalline sintered ceramics was, however, significant in the ballistics tests even when, as described above, a particularly Al-rich (that is, less hard) spinel monocrystal was compared with particularly hard (that is, fine-crystalline) sintered spinel ceramics of a composition close to n=1.

The purity to be demanded of the monocrystalline magnesium aluminate spinels usable for composite panes according to the invention results solely from the demands of the individual user for colorlessness; thus, low iron impurities and/or Cr impurities of, for example, 5 ppm lead to a moderate pink-brownish coloration only noticeably at thicknesses >10 mm. Typically, the sum of all cationic impurities is less than 1000 ppm (0.1% by weight), advantageously <500 ppm with Si as the main contaminant and a sum of Fe+Cr<10 ppm.

The aforementioned observation of a high protective effect, specifically of the monocrystalline magnesium aluminate spinels, is even more surprising, as it is not only in contrast to the different behavior of the polycrystalline spinel ceramics, but also the, as is known, significantly less advantageous ballistic stability of the $Al_2O_3$ monocrystals—even though the latter should have an advantage with a significantly higher hardness and a higher modulus of elasticity than the monocrystalline magnesium aluminate spinel. An extensive explanation of the surprising observation of a higher protective effect of the spinel monocrystal, which is rather at a disadvantage in terms of hardness, E-moduli and strength parameters, is of course not yet possible: Because the possibility of a monocrystalline magnesium aluminate spinel superior to the polycrystalline spinel ceramics and also to the sapphire has not yet been taken into consideration anywhere, any occasion for the analyses required for a possible explanation was previously absent. At the present time, the lone starting point is the fact that monocrystalline magnesium aluminate spinel is known for its cleavage along {001} planes (A. Kuramata, et. al.: Appl. Phys. Lett. 67 (1995) 17, 2521-2523), while the $Al_2O_3$ monocrystal (corundum) is considered uncleavable (for example, http://en.wikipedia.org/wiki/Sapphire; even sapphire planes of the lowest fracture propagation resistance exhibit a critical stress intensity factor $K_{IC}$ of approx. 2-2.5 MPa√m [A. Krell, et al.: phys. stat. sol. (a) 52 (1979) K45-49], thus still at the level of brittle polycrystalline ceramics). This easy cleavage could, during an impact of a projectile in the monocrystalline magnesium aluminate spinel, lead to a faster, more extensive fracture propagation than in sapphire, and for faster fracture propagation, a fracture-mechanics model predicts the formation of larger fragments of the deteriorating brittle body (Zhang, et al.: Transactions of the ASME 70 (2003) 5, 454-457). However, larger ceramic fragments are subject to a larger inertia and could, according to a different model, in this manner have a greater abrasive effect on the penetrating projectile (A. Krell: Am. Ceram. Soc. Bull. 86 (2007) 4, 9201-9204).

Additional analyses for the clarification of the surprising effects are therefore necessary in the future.

The safety applications of the transparent composite panes according to the invention are to be understood within the scope of this invention to mean applications in the civilian sector and military sector in which, in particular, light composite panes with a suitable transparency and high protective effect are needed and which, in particular, can be used for safety panes or windows or protective panes or windows in vehicles, flying objects or for personal protection.

The invention is explained below in greater detail with the aid of an exemplary embodiment.

Figure 2:
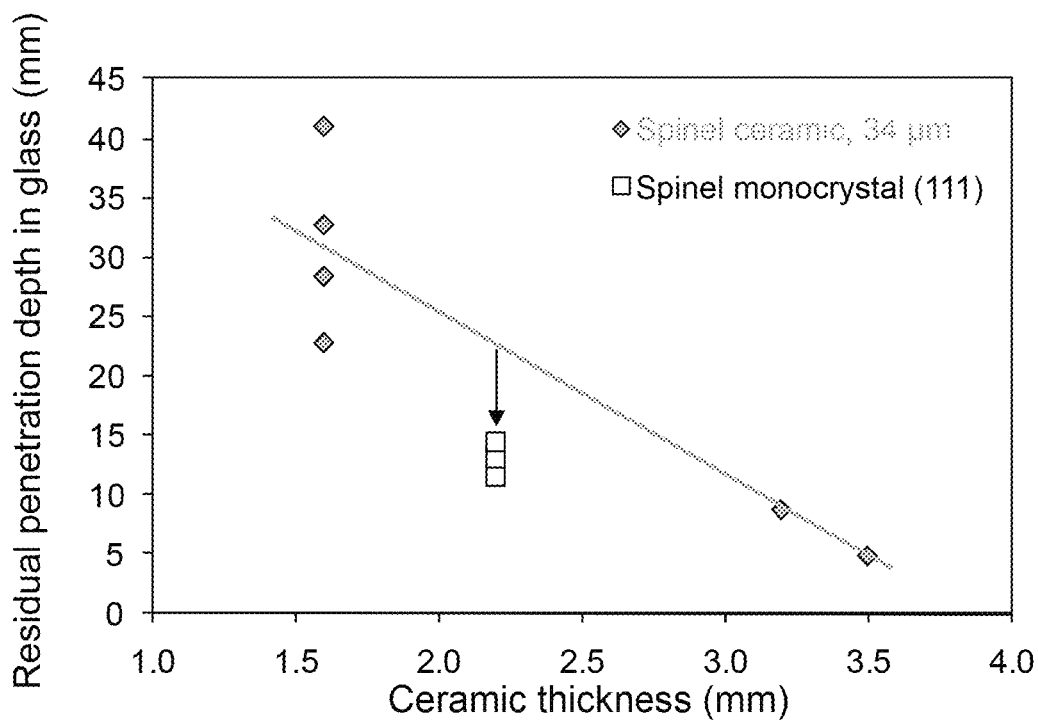

In this matter:

FIG. 1 shows an in-line transmission of a 4.4 mm thick monocrystalline magnesium aluminate spinel in comparison with the theoretical transmission, and FIG. 2 shows measured residual penetration depths in a glass backing as a function of the thickness of the plates to be tested.

EXAMPLE 1

A transparent composite pane was constructed in the following manner:
  a plate of a 4.4 mm thickness of polished monocrystalline magnesium aluminate spinel of the composition $MgO \cdot nAl_2O_3$ where n=3; the lateral surface exhibited the crystallographic orientation (111),
  a triple-laminated glass backing (9 mm thickness of each layer),
  a rear plate of polycarbonate (3 mm thickness),
connected respectively by a 0.1 mm thin layer of an organic transparent adhesive consolidated under UV light (Delo Photobond GB310).

Beforehand, the in-line transmission of the 4.4 mm thick plate of polished monocrystalline magnesium aluminate spinel was measured by means of a Cary 4000 spectrometer of the company Varian Inc. (Mulgrave, Vic., Australia) with a beam passing through in the <111> direction close to the theoretical (determined by the wavelength-independent refractive index) transmission (FIG. 1).

The demonstration of the surprisingly increased stability of transparent composites with monocrystalline magnesium aluminate spinel in comparison with composites of this type with polycrystalline magnesium aluminate sintered ceramics or with sapphire (monocrystalline $Al_2O_3$) of differing orientation occurred through separate ballistics tests of the DoP type ("depth of penetration"). Here, the residual penetration depth of a projectile (or projectile debris) in a solid backing after perforation of the ceramic plates or monocrystalline plates of a certain thickness that are to be tested is measured. An increased mechanical stability is thereby characterized by lower DoP.

A DoP test with a transparent glass backing is, of course, particularly well-suited for the evaluation of the stability of monocrystalline or polycrystalline transparent oxide materials in transparent composite panes. The accuracy of proper measurements of the penetration depths in brittle, cracking glass could, however, meet with doubt, which is why additional tests with a metallic backing (an Al alloy) occurred. The selection of aluminum was thereby justified in that this type of alloys with E-moduli of 70-100 GPa have a stiffness similar to glass (60-80 GPa). All tests occurred with 7.62 mm×51APFN steel core projectiles at an impact speed of 840-850 m/s.

(a) Comparative Stability Test in Front of Al Backing
  In comparison
    with 4.45 mm thick plates of polycrystalline spinel ceramics of differing grain size and hardness, but a uniform composition of $MgO \cdot nAl_2O_3$ where n=1
    and also with $Al_2O_3$ monocrystals of differing orientation and a 4 mm thickness (corresponding to an equal areal density when compared with the spinel plates),
4.45 mm thick plate of polished monocrystalline magnesium aluminate spinel showed, despite the lower hardness thereof, the greater protective effect:

| Ceramic | Hardness HV10 | Penetration depth $t_R$ |
|---|---|---|
| (111) monocrystal MgO•3Al$_2$O$_3$ | 11.0 GPa | 6.0 mm |
| Polycrystalline sintered ceramics (composition MgO•1Al$_2$O$_3$) | | |
| with avg. grain size of  0.35 µm | 14.7 GPa | 8.0 mm |
| 1.40 µm | 13.6 GPa | 7.8 mm |
| 13.2 µm | 12.7 GPa | 7.1 mm |
| 73 µm | 12.0 GPa | 8.2 mm |
| (0001) α Al$_2$O$_3$ monocrystal | 13.4 GPa | 16.5 mm |
| (1120) α Al$_2$O$_3$ monocrystal | 14.9 GPa | 11.0 mm |

(b) Comparative Stability Test in Front of Glass Backing

The stability of plates of monocrystalline magnesium aluminate spinel (orientation (111), composition MgO3.Al$_2$O$_3$) was compared here with the stability of a transparent polycrystalline spinel sintered ceramic, the average grain size of which had been set to 34 µm by a suitable thermal treatment. Because of this, the hardness of the sintered ceramic was only HV10=12.3±1.0 GPa, but was thus still higher than that of the tested monocrystalline magnesium aluminate spinel (HV10=11.0±0.3 GPa).

Even in these tests for the monocrystalline magnesium aluminate spinel, FIG. 2 still shows the—in terms of thickness—lower penetration depth of the projectile debris in the glass backing and, therefore, a surprisingly higher stability.

The invention claimed is:

1. Transparent composite pane for safety applications, wherein the composite is composed of multiple layers which are arranged behind one another and of which at least one layer is composed of one plate, or of plates arranged in a mosaic or in series, of monocrystalline magnesium aluminate spinel.

2. Transparent composite pane according to claim 1, wherein other layers of the multiple layers are composed of glasses, ceramics and/or plastics.

3. Transparent composite pane according to claim 1, wherein the multiple layers are connected to one another by an adhesion-promoting connection medium.

4. Transparent composite pane according to claim 1, wherein the at least one layer comprises plural plates of monocrystalline magnesium aluminate spinel arranged in a mosaic or in series.

5. Transparent composite pane according to claim 1, wherein the at least one layer comprises plural plates composed of monocrystalline magnesium aluminate spinel with joints between the plural plates of monocrystalline magnesium aluminate spinel wherein said joints are respectively covered outwardly by at least one larger cover plate of a transparent material.

6. Transparent composite pane according to claim 1, wherein the at least one layer is composed of monocrystalline magnesium aluminate spinel with a <111> orientation of the surface normals.

7. Transparent composite pane according to claim 1, wherein the monocrystalline magnesium aluminate spinel has a chemical composition of MgO.nAl$_2$O$_3$ with a parameter n within the range of 0.9 to 3.5.

8. A multi-layer transparent composite pane for safety applications, wherein at least one layer is composed of one or more plates whose material is formed without MgO precipitations or Al$_2$O$_3$ precipitations, and has a monocrystalline magnesium aluminate spinel composition of MgO.nAl$_2$O$_3$ with a parameter n within a range of 0.9 to 3.5.

9. The composite pane of claim 8, wherein the one or more plates comprises a moasic structure.

10. The composite pane of claim 8, wherein the one or more plates comprises an arrangement of plates in series on a backing.

11. The composite pane of claim 8, wherein the at least one layer is composed of only one plate whose material is formed without MgO precipitations or Al$_2$O$_3$ precipitations, and has a monocrystalline magnesium aluminate spinel composition of MgO.nAl$_2$O$_3$ with a parameter n within a range of 0.9 to 3.5.

12. The composite pane of claim 8, wherein at least one other layer of the multi-layer composite pane comprises one or more plates whose material has a monocrystalline magnesium aluminate spinel composition.

13. The composite pane of claim 8, wherein at least one other layer of the multi-layer composite pane comprises one or more plates whose material is formed without MgO precipitations or Al$_2$O$_3$ precipitations, and has a monocrystalline magnesium aluminate spinel composition of MgO.nAl$_2$O$_3$ with a parameter n within a range of 0.9 to 3.5.

14. A multi-layer transparent composite pane for, safety applications, wherein at least one layer is composed of one or more plates whose material has a monocrystalline magnesium aluminate spinel composition of MgO.nAl$_2$O$_3$ with a parameter n equal to 3 and with a <111> orientation of the surface normals.

15. The composite pane of claim 14, wherein the material of the at least one layer is formed without MgO precipitations or Al$_2$O$_3$ precipitations.

16. The composite pane of claim 14, wherein the one or more plates comprises a moasic structure.

17. The composite pane of claim 14, wherein the one or more plates comprises plural plates arranged in series.

18. The composite pane of claim 14, wherein the one or more plates is only one plate.

19. A method of using the transparent composite pane for safety applications and/or protective applications, said method comprising:
utilizing the transparent composite pane of claim 1 in panes or windows in the civilian sector and military sector.

20. The method according to claim 19, wherein the panes or windows are in one of:
vehicles,
flying objects, or
personal protection.

* * * * *